United States Patent
Wu

(10) Patent No.: US 11,929,255 B2
(45) Date of Patent: Mar. 12, 2024

(54) METHOD OF HIGH-DENSITY PATTERN FORMING

(71) Applicant: CHANGXIN MEMORY TECHNOLOGIES, INC., Hefei (CN)

(72) Inventor: Chen En Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 274 days.

(21) Appl. No.: 17/433,448

(22) PCT Filed: May 25, 2021

(86) PCT No.: PCT/CN2021/095842
§ 371 (c)(1),
(2) Date: Aug. 24, 2021

(87) PCT Pub. No.: WO2022/022035
PCT Pub. Date: Feb. 3, 2022

(65) Prior Publication Data
US 2022/0344157 A1 Oct. 27, 2022

(30) Foreign Application Priority Data
Jul. 29, 2020 (CN) .......................... 202010745245.2

(51) Int. Cl.
*H01L 21/033* (2006.01)
*H01L 21/308* (2006.01)
(Continued)

(52) U.S. Cl.
CPC ...... *H01L 21/0337* (2013.01); *H01L 21/0338* (2013.01); *H01L 21/3086* (2013.01);
(Continued)

(58) Field of Classification Search
None
See application file for complete search history.

(56) References Cited

U.S. PATENT DOCUMENTS

| 7,964,510 B2 | 6/2011 | Heo |
| 8,969,205 B2 | 3/2015 | Shen |

(Continued)

FOREIGN PATENT DOCUMENTS

| CN | 101546694 A | 9/2009 |
| CN | 102299137 A | 12/2011 |

(Continued)

OTHER PUBLICATIONS

First Office Action of the Chinese application No. 202010745245.2, dated Jul. 25, 2022.

(Continued)

*Primary Examiner* — Suberr L Chi
*Assistant Examiner* — Carnell Hunter, III
(74) *Attorney, Agent, or Firm* — Ladas & Parry LLP

(57) ABSTRACT

Provided is a method of high-density pattern forming, which includes: providing a substrate; forming a hard mask layer on the substrate; forming a sacrificial layer on the hard mask layer; forming photoresists arranged at intervals on the sacrificial layer; etching the sacrificial layer to enable the sacrificial layer to form a mandrel corresponding to the photoresist one by one, wherein a cross-sectional size of the mandrel gradually decreases from an end of the mandrel away from the hard mask layer to an end close to the hard mask layer; forming an isolation layer on the mandrel; removing the isolation layer on the top of the mandrel, the isolation layer covering the hard mask layer, and the mandrel to form an isolation sidewall pattern; and transferring the isolation sidewall pattern to the hard mask layer.

12 Claims, 8 Drawing Sheets

(51) Int. Cl.
   *H01L 21/311* (2006.01)
   *H01L 21/768* (2006.01)
(52) U.S. Cl.
   CPC .... *H01L 21/3088* (2013.01); *H01L 21/31144* (2013.01); *H01L 21/76816* (2013.01)

(56) References Cited

U.S. PATENT DOCUMENTS

| | | |
|---|---|---|
| 9,330,913 B2 | 5/2016 | You |
| 10,340,136 B1 | 7/2019 | Agnew |
| 2009/0246961 A1* | 10/2009 | Heo .................... H01L 21/0337 257/E21.536 |
| 2011/0316165 A1* | 12/2011 | You .................. H01L 29/40114 438/618 |
| 2014/0291735 A1 | 10/2014 | Shen et al. |
| 2015/0214064 A1 | 7/2015 | Pritchard et al. |
| 2020/0402838 A1* | 12/2020 | Gu .................... H01L 21/76224 |

FOREIGN PATENT DOCUMENTS

| | | |
|---|---|---|
| CN | 103515197 A | 1/2014 |
| TW | 200839954 A | 10/2008 |

OTHER PUBLICATIONS

International Search Report in the international application No. PCT/CN2021/095842, dated Aug. 4, 2021.
English translation of the Written Opinion of the International Search Authority in the international application No. PCT/CN2021/095842, dated Aug. 4, 2021.

* cited by examiner

METHOD OF HIGH-DENSITY PATTERN FORMING

CROSS-REFERENCE TO RELATED APPLICATIONS

The present application is a national stage entry of International Patent Application No. PCT/CN2021/095842, filed on May 25, 2021, which claims priority to Chinese Patent Application No. 202010745245.2, filed on Jul. 29, 2020, the entire contents of which are incorporated herein by reference.

TECHNICAL FIELD

The present disclosure relates to the field of semiconductor manufacturing technologies, in particular to a method of high-density pattern forming.

BACKGROUND

With the development of technologies and the increase in people's needs, semiconductor devices tend to have a smaller size, which makes it particularly urgent to manufacture highly integrated semiconductor devices. Generally, a self-aligned dual imaging technology (SADP) is adopted in the process of manufacturing a semiconductor device to increase density of the pattern. However, as shown in FIG. 1, after a photoresist pattern is transferred to a sacrificial layer during the process, the sacrificial layer may form a mandrel 100 corresponding to the original photoresist one by one. Then, an oxide layer 200 is covered and deposited on the mandrel by an atomic deposition process, during which the mandrel material may generate gas due to the chemical reactions or thermal effects. As a result, the adhesion performance of the oxide layer 200 may be reduced, and a gap may be generated between the oxide layer 200 and the mandrel, which means that the oxide layer 200 is not strictly attached to the sidewall of the mandrel. Or, during the deposition process, since the oxide layer 200 and the mandrel are not closely attached to each other due to their characteristic differences in material such as stress, a gap may be also generated therebetween, which may thereby cause the subsequent pattern transferring to be uneven.

SUMMARY

A main object of the present disclosure is to provide a high-density pattern forming, with the high-density pattern being precise and uniform.

To achieve the object, according to an aspect of the present disclosure, a method of high-density pattern forming is provided, which comprises: providing a substrate; forming a hard mask layer on the substrate; forming a sacrificial layer on the hard mask layer; forming photoresists arranged at intervals on the sacrificial layer; etching the sacrificial layer to enable the sacrificial layer to form a mandrel corresponding to the photoresist one by one, wherein a cross-sectional size of the mandrel gradually decreases from an end of the mandrel away from the hard mask layer to an end close to the hard mask layer; forming an isolation layer on the mandrel; removing the isolation layer on the top of the mandrel, the isolation layer covering the hard mask layer, and the mandrel to form an isolation sidewall pattern; and transferring the isolation sidewall pattern to the hard mask layer.

BRIEF DESCRIPTION OF DRAWINGS

The aforesaid and other features and advantages of the present disclosure will be more apparent by describing the exemplary embodiments thereof in detail with reference to the accompanying drawings.

DESCRIPTION OF EMBODIMENTS

Figure 1:
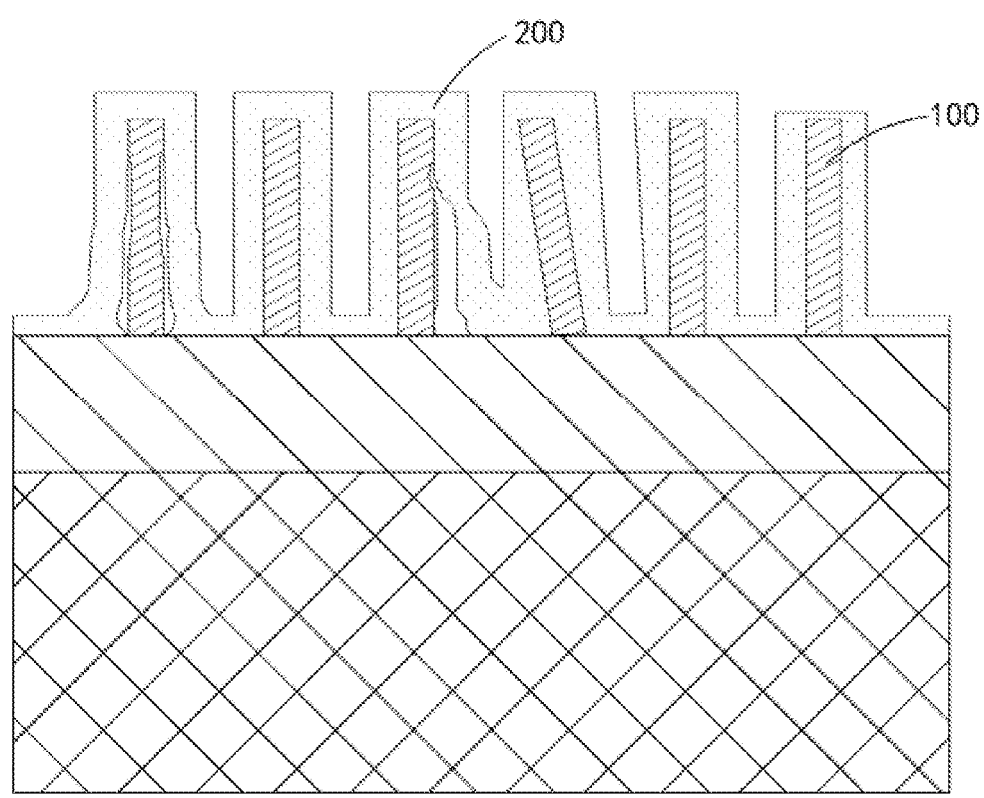
FIG. 1 is a schematic diagram of a gap between an oxide layer and a mandrel in the related art.

Exemplary embodiments will now be described more fully with reference to the accompanying drawings. However, the exemplary embodiments may be implemented in various forms, and shall not be limitedly understood as the embodiments set forth herein. On the contrary, provision of these embodiments may enable the present disclosure to be comprehensive and complete and thereby convey the concept of exemplary embodiments to those skilled in the art. The same reference signs in the drawings may indicate the same or similar structures, and thus their detailed descriptions will be omitted.

Different exemplary embodiments of the present disclosure will be described below with reference to the accompanying drawings that form a part of the present disclosure. In the drawings, different exemplary structures that can implement various aspects of the present disclosure are shown in an exemplary way. It shall be understood that other specific solutions of components, structures, exemplary devices, systems, and steps may be adopted, and structural and functional modifications can be made without departing from the scope of the present disclosure. Moreover, although different exemplary features and elements of the present disclosure can be described in the Description with terms such as "above", "between", "within", etc., these terms are adopted herein only for convenience, for example, according to the directions of examples in the drawings. Nothing in this Description shall be understood as a structure that can only fall within the scope of the present disclosure under a requirement of a specific three-dimensional direction. In addition, the terms "first", "second", and the like in the claims are adopted only as marks rather than the numerical limitation on the objects.

The present disclosure provides a method of high-density pattern forming. A reference may be made to FIG. 2 to FIG. 7 which are schematic structural diagrams of the semiconductor device in different steps. The method of high-density pattern forming comprises: providing a substrate 1; forming a hard mask layer 2 on the substrate 1; forming a sacrificial layer 3 on the hard mask layer 2; forming photoresists 4 arranged at intervals on the sacrificial layer 3; etching the sacrificial layer 3 to enable the sacrificial layer to form a mandrel 5 corresponding to the photoresist 4 one by one, wherein a cross-sectional size of the mandrel 5 gradually decreases from an end of the mandrel 5 away from the hard mask layer 2 to an end close to the hard mask layer 2; forming an isolation layer 6 on the mandrel 5; removing the isolation layer 6 on the top of the mandrel, the isolation layer 6 covering the hard mask layer 2, and the mandrel 5 to form an isolation sidewall pattern; and transferring the isolation sidewall pattern to the hard mask layer 2.

The cross-sectional size of the mandrel 5 gradually decreases from the end of the mandrel 5 away from the hard mask layer 2 to the end close to the hard mask layer 2. Thus, in the process of depositing the isolation layer 6, even if gas is generated at the bottom of the mandrel 5 and thereby causes a gap between the isolation layer 6 and the sidewall of the mandrel 5, the bottom of the mandrel 5, which has a small size, can be recessed inward relative to the top, and the recessed portion can offset the gap between the mandrel 5 and the isolation layer 6 as caused by the gas or characteristic differences in material. As a result, the outer contour of the isolation layer 6 will not be affected, the isolation layer 6 may be deposited uniformly, and the aspect ratio of the mandrel 5 may meanwhile be increased, which can prevent the adhesion with the outer contour of the isolation layer 6, deposit the isolation layer 6 uniformly, and thereby transfer the pattern more accurately and uniformly.

Figure 3:
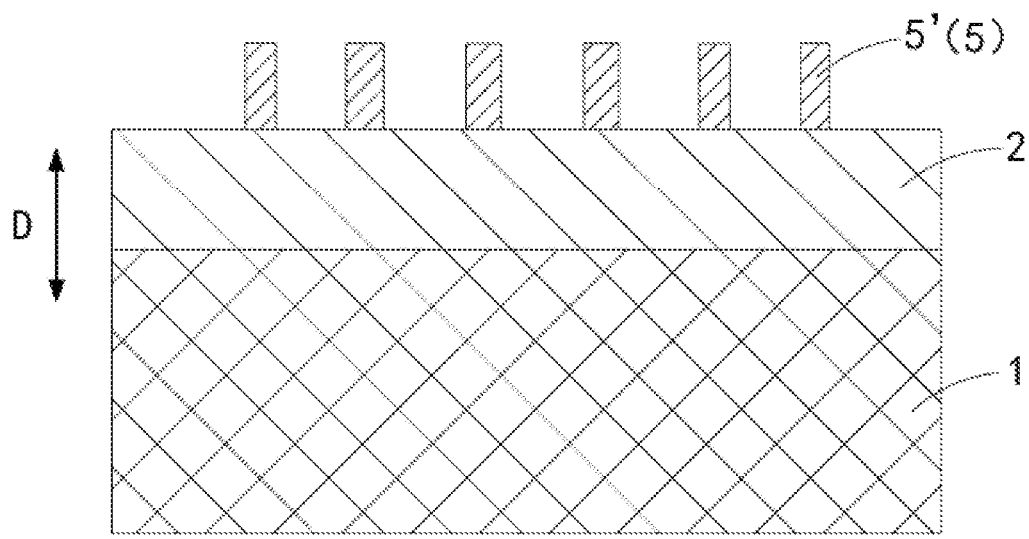

It should be noted that "up", "down", "top" and "bottom" may be defined in the present disclosure. For example, the substrate 1, the hard mask layer 2, the sacrificial layer 3, and the photoresist 4 are stacked in sequence down to up, the substrate 1 is disposed at the bottom of the semiconductor device, and the photoresist 4 is disposed at the top. Thus, the aforesaid end of the mandrel 5 close to the hard mask layer 2 is the bottom of the mandrel 5, and the end of the mandrel 5 away from the mask layer is the top of the mandrel 5. The vertical direction D in the present disclosure refers to a direction perpendicular to the plane of the substrate 1, as shown in FIG. 3. The contents above are only for the convenience of explaining the positions of the various components, and do not have a limiting effect.

Figure 4:
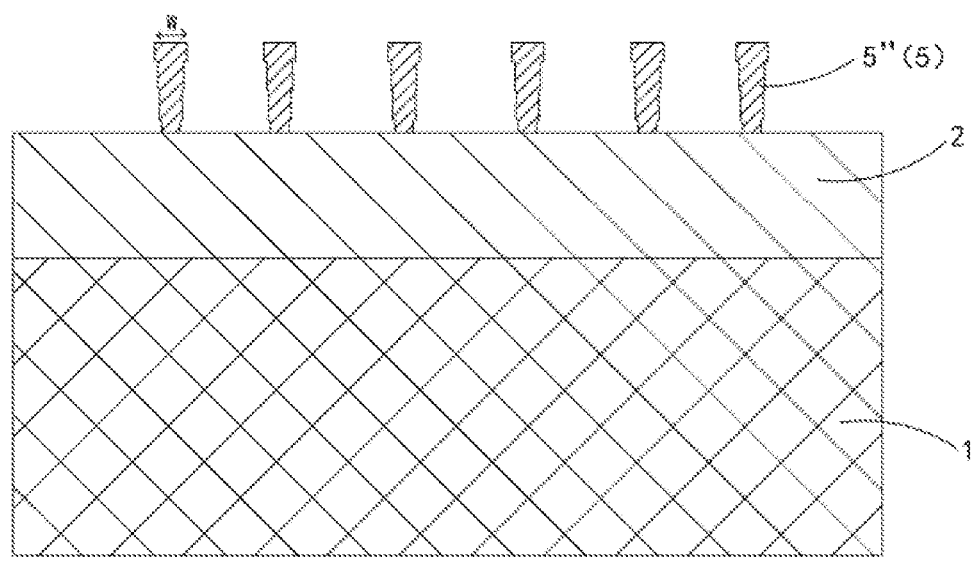

Furthermore, the cross-sectional size W of the mandrel of the present disclosure is a width size of the cross section as shown by the double arrow in FIG. 4.

The method of high-density pattern forming according to the present disclosure will be described in detail below.

Figure 2:
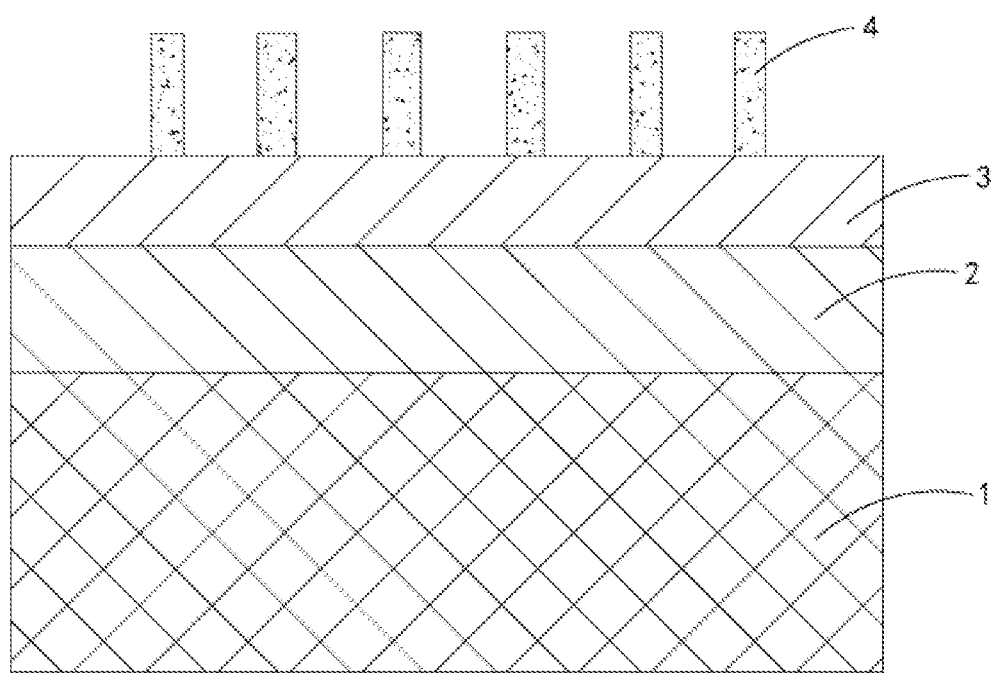
FIG. 2 to FIG. 7 are schematic structural diagrams of a semiconductor device in different steps of a method of high-density pattern forming according to the present disclosure.

As shown in FIG. 2, a substrate 1 is provided, and a hard mask layer 2, a sacrificial layer 3, and photoresists 4 arranged at intervals are formed on the substrate 1 from down to up.

The substrate 1 may be silicon, silicon carbide, silicon nitride, silicon-on-insulator (SOI), stacking-silicon-on-insulator (SSOI), stacking-silicon-germanium-on-insulator (S—SiGeOI), silicon-germanium-on-insulator (SiGeOI) and germanium-on-insulator (GeOI), etc. In this embodiment, the substrate 1 is silicon. The hard mask layer 2 may be silicon oxide, silicon nitride, polysilicon, or other materials and a combination thereof. The hard mask layer 2 may be deposited on the substrate 1 by a chemical vapor deposition (CVD) process. The hard mask layer 2 may be a layer, two layers or a combination of multiple layers, which can be configured by those skilled in the art according to actual process requirements. A layer of photoresist 4 may be formed as the photoresists 4 arranged at intervals by exposure and development. That is, a low-density pattern is formed initially.

As shown in FIG. 3, the sacrificial layer 3 is etched in the first etching environment, and the pattern of the photoresists 4 arranged at intervals is transferred to the sacrificial layer 3, such that the sacrificial layer 3 forms a first mandrel 5' corresponding to the photoresist 4 one by one. The process of the first etching environment is dry etching to remove the photoresist 4 and remove the rest of the sacrificial layer 3 except for the first mandrel 5'. In the present disclosure, the dry etching is implemented by taking $O_2$ and $C_xF_y$ as the etchant. Specifically, the $C_xF_y$ may be $CF_4$, the power may be 300 to 2000 W, and the pressure may be 0.1 to 50 mtorr, where mtorr is a pressure unit millitorr.

After the etching in the first etching environment, the first mandrel 5' has a same shape with the photoresist 4. As shown in FIG. 3, the cross-sectional shape of the first mandrel 5' may be rectangular or square, which means that the sidewall of the first mandrel 5' extends in the vertical direction. In other words, the cross section of the first mandrel 5' is aequilatus.

As shown in FIG. 4, the sidewall of the first mandrel 5' is etched for a second time. The sidewall of the first mandrel 5' is etched to form the second mandrel 5" under a second etching environment in which a bias voltage is added on the basis of the first etching environment. The first mandrel 5' and the second mandrel 5" indicate different states of the same mandrel 5 in different steps. The cross-section size W of the second mandrel 5" gradually decreases from the top to the bottom of the second mandrel 5", such that the second mandrel 5" has a structure having a wide top and a narrow bottom.

Generally, when the isolation layer 6 is covered and deposited on the mandrel 5, the material of the mandrel 5 may generate gas due to the chemical reactions or thermal effects, and the gas may cause the isolation layer 6 to not be closely attached to the mandrel 5. For example, when the mandrel 5 is made of C material, the gas such as CO may be generated, and the adhesion performance between the isolation layer 6 and the mandrel 5 may be rather poor since the material C of the mandrel 5 has a great hardness and the isolation layer 6 (such as silicon oxide) is relatively soft. As a result, a gap may easily occur between the isolation layer 6 and the mandrel 5, which thereby causes the outer contour of the isolation layer 6 to be uneven. A second mandrel 5" having a wide top and a narrow bottom is formed by etching the sidewall of the first mandrel 5' for a second time. In the width direction, the bottom of the second mandrel 5" is recessed inward with respect to the top, and when the isolation layer 6 is deposited on the second mandrel 5", the recessed portion may offset the gap between the mandrel 5 and the isolation layer 6 caused due to the gas or characteristic differences in material, which thereby prevents affecting the outer contour of the isolation layer 6 and further prevents the adhesion between adjacent isolation layers 6.

Furthermore, the process of the second etching environment is also dry etching by taking $O_2$ and $CF_4$ as the etchant. In addition, the dry etching in the second etching environment has a greater bias voltage than the dry etching in the first etching environment.

Furthermore, the two etching environments may both be completed in a one-step etching process, which means to etch the sacrificial layer 3 by taking $O_2$ and $CF_4$ as the etching gas. After the pattern of the photoresist 4 is transferred to the sacrificial layer 3, the mandrel 5 corresponding to the photoresist 4 one by one is formed, and then, a bias voltage is added to etch the bottom of the sidewall of the mandrel 5 to form the mandrel 5 having a wide top and a narrow bottom.

Specifically, the bias voltage in the second etching environment is 100 to 500 W. The increasing bias voltage may increase the kinetic energy of ions at the bottom of the mandrel 5 for etching the sidewall, which enables to etch the sidewall of the mandrel 5 for a second time, and thereby enable the sidewall at the bottom of the mandrel 5 to have a smaller width than the sidewall at the top.

Specifically, in the second etching environment, the pressure for the dry etching is 0.1 to 50 mtorr, and the upright power is 300 to 2000 W.

Furthermore, when the sidewall of the first mandrel 5' is etched, an angle between the etching direction and the vertical direction is 70 to 89.9°, and may in particular be 75°, 78°, 80°, or 85°. That is, the sidewall of the first mandrel 5' is etched to different degrees in the vertical direction D to further enhance the etching of the sidewall of the bottom of the first mandrel 5', such that the bottom of the second mandrel 5" as formed has a smaller width. Those skilled in the art can control the parameter selection of the second etching environment according to actual needs, which will not be specifically defined here.

Furthermore, the material of the mandrel 5 may also be a spin-on-hard mask (SOH) that can be well combined with the isolation layer 6. However, since the SOH material is relatively soft, it may collapse when the isolation layer 6 is deposited. In order to improve the hardness, C, N and H elements may be doped in the SOH. After the doping, a concentration of each doping element in the material of the mandrel 5 accounts for 60% to 90% of C, 0% to 30% of N, and 0% to 30% of H. Herein, the concentration percentage of C may be 70%, 80%, 85%, the concentration percentage of N may be 20%, 10%, 3%, and the concentration percentage of H may be 2%, 10%, 20%.

In addition, the percentage (proportion) of C element in the material of the mandrel 5 gradually decreases from the end of the mandrel 5 close to the hard mask layer 2 to the end away from the hard mask layer 2. That is, the percentage of C element gradually decreases from the bottom to the top of the mandrel 5. Herein, the concentration percentage of C element at the end (bottom) of the mandrel 5 close to the hard mask layer 2 is 75% to 90%, such as 78%, 80%, or 85%; and the percentage of C element at the end (top) of the mandrel 5 away from the hard mask layer 2 is 60% to 75%, such as 62%, 65%, or 68%. The higher the proportion of the C element, the greater the hardness of the mandrel 5. Thus, the bottom of the mandrel 5 has a greater hardness, thereby preventing the collapse.

Furthermore, the mandrel 5 may have a height of 30 to 50 nm, which is smaller than the height of the mandrel in the traditional process and thereby can prevent the mandrel from collapsing. In addition, since the aspect ratio of the mandrel 5 is increased, the adhesion with the outer contour of the isolation layer 6 can be effectively avoided.

Further, the top of the mandrel 5 has a width of 20 to 22 nm, and the bottom has a width of 18 to 21.5 nm, ensuring that the top has a greater width than the bottom. For example, when the top has a width of 21 nm, the width of the bottom may be 19 nm, 20 nm or 20.5 nm. The size may be selected by those skilled in the art according to actual needs, which will not be specifically defined here.

Furthermore, in order to further increase the bonding strength between the sidewall of the second mandrel 5" and the isolation layer 6, the method, after etching the sidewall of the first mandrel 5' to form the second mandrel 5", further comprises: roughening the sidewall of the second mandrel 5" to increase the surface roughness of the sidewall, thereby increasing the adhesion performance between the sidewall of the second mandrel 5" and the isolation layer 6. Specifically, roughening of the sidewall of the second mandrel 5" may be implemented by the chemical vapor deposition which is executed with N2 and He by heating to 300 to 500° C. with a power of 100 to 1000 W.

Furthermore, after forming the second mandrel 5" (that is, a final mandrel 5) according to the aforesaid embodiment, respective second mandrels 5" and the gap between two adjacent second mandrels 5" are cleaned by wet cleaning to remove the impurity particles between the mandrels 5. Then, the residues are removed with N2 to prevent impurities and gas that may affect the combination with the isolation layer 6 from remaining at the bottom of the second mandrel 5". Specifically, the blowing direction of N2 and the vertical direction D form a certain angle, such that N2 may be blown as far as possible to the bottom of the second mandrel 5".

Figure 5:
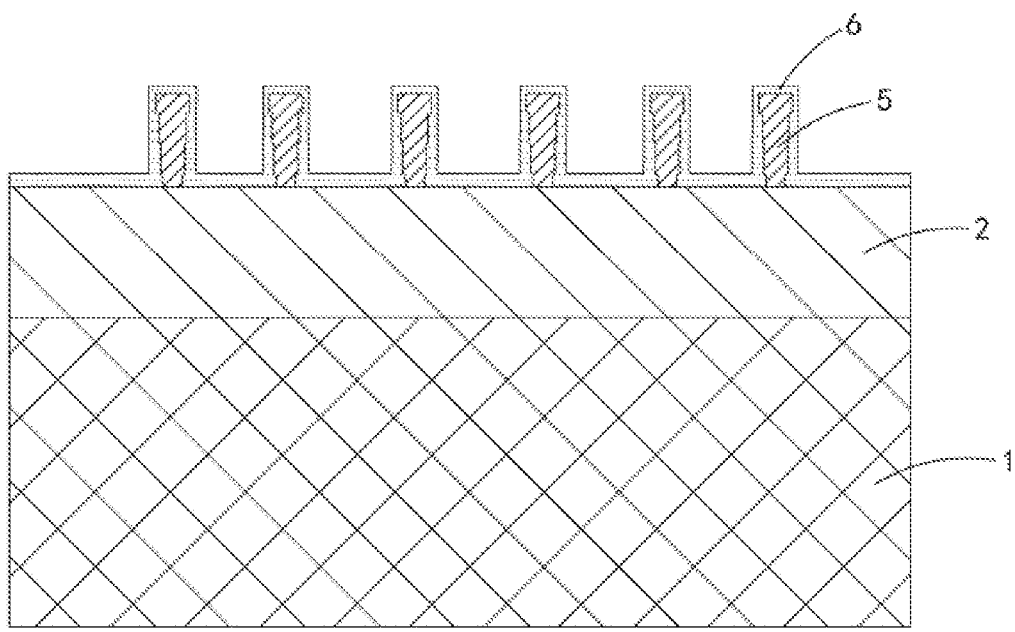

As shown in FIG. 5, after the second mandrel 5" according to the aforesaid embodiment is formed, the isolation layer 6 is deposited on the second mandrel 5" and the bare hard mask layer 2 with an atomic layer deposition technique. The isolation layer 6 may be silicon oxide.

In order to increase the density of the pattern, the thickness of the isolation layer 6 may be the same. An isolation sidewall pattern is formed after removing the isolation layer 6 on the top of the mandrel 5, the isolation layer 6 covering the hard mask layer 2, and the mandrel 5, which is a pattern of the remaining isolation layers 6 that are arranged at intervals. The isolation sidewall pattern has a greater density than the pattern formed by the second mandrel 5", and may have a density twice the density of the pattern formed by the second mandrel 5".

Figure 6:
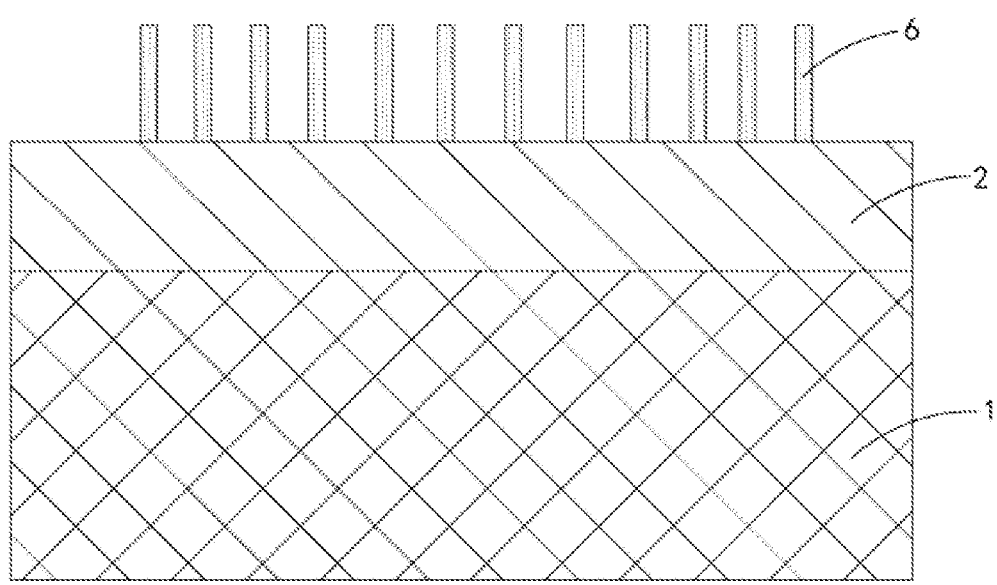
Figure 7:
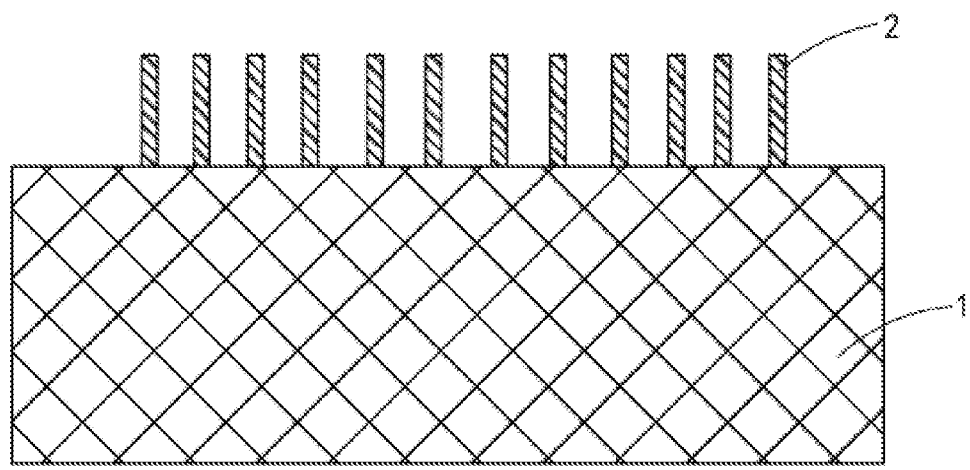

As shown in FIGS. 6 and 7, the isolation sidewall pattern formed according to the aforesaid embodiment is transferred to the hard mask layer 2, and then, the pattern of the hard mask layer 2 is transferred to the substrate 1 (not shown in the figure) to form a semiconductor device with a high-density pattern.

Figure 8:
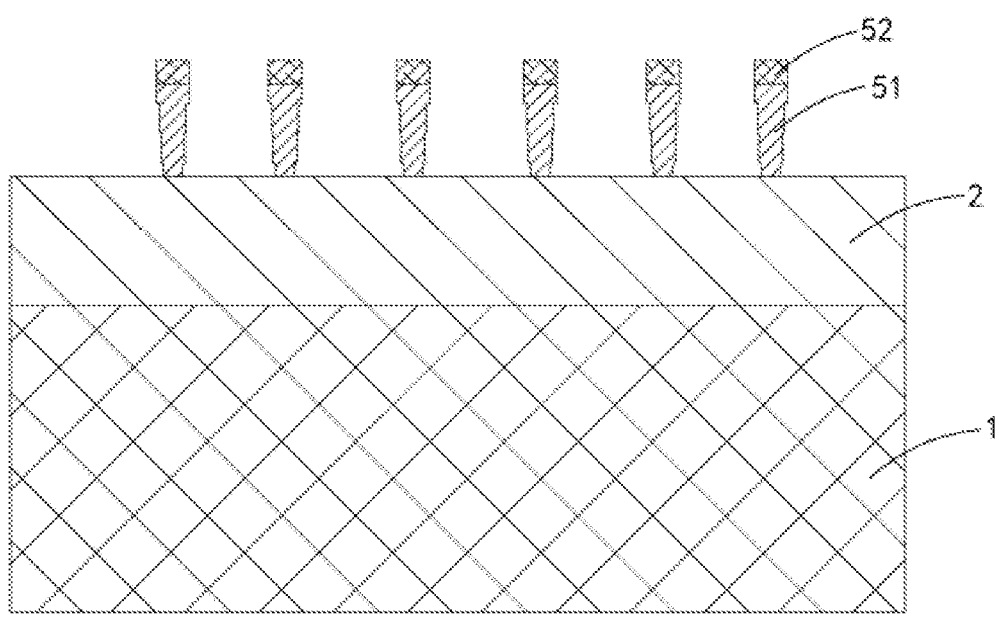
FIG. 8 is a schematic structural diagram of a semiconductor device according to another exemplary embodiment of the present disclosure.

In addition, there may be two layers of sacrificial layer 3. The lower layer is a first sacrificial layer and may have a material of carbon or SOH, and the upper layer is a second sacrificial layer and may have a material of silicon oxynitride (SiON). The first sacrificial layer may have a same or different thickness with the second sacrificial layer. For example, the thickness of the first sacrificial layer is 2 to 10 times the thickness of the second sacrificial layer. The first mandrel 5' is formed by a combination of the first sacrificial layer and the second sacrificial layer, and the second mandrel 5" is formed after etching the sidewall of the first mandrel 5' for a second time. As shown in FIG. 8, the second mandrel 5" (the mandrel 5 as finally formed) comprises a first portion 51 formed by the first sacrificial layer and a second portion 52 formed by the second sacrificial layer. It should be noted that etching the sidewall of the first mandrel 5' may be implemented by only etching the sidewall of C or SOH portion and not etching the sidewall of SiON portion, such that the SiON portion can protect the C or SOH portion, and the energy consumption can be saved.

In summary, in the present disclosure, the cross-sectional size W of the mandrel 5 gradually decreases from the end of the mandrel away from the hard mask layer 2 to the end close to the hard mask layer 2. Thus, in the process of depositing the isolation layer 6, even if gas is generated at the bottom of the mandrel 5 and thereby causes a gap between the isolation layer 6 and the sidewall of the mandrel 5, the bottom of the mandrel 5, which has a small size, can be recessed inward relative to the top, and the recessed portion can offset the gap between the mandrel 5 and the isolation layer 6 as caused by the gas or characteristic differences in material. As a result, the outer contour of the isolation layer 6 will not be affected, and the aspect ratio of the mandrel 5 may meanwhile be increased, which can prevent the adhesion with the outer contour of the isolation layer 6, deposit the isolation layer 6 uniformly, and thereby transfer the pattern more accurately and uniformly.

It shall be understood that the present disclosure does not limit its application to the detailed structure and arrangement of the components proposed in this Description. The present disclosure may have other embodiments, and can be implemented and executed in various ways. The aforesaid deformations and modifications fall within the scope of the present disclosure. It shall be understood that the present disclosure as disclosed and defined in this Description extends to all alternative combinations of two or more individual features as mentioned or being obvious in the text and/or drawings. All these different combinations constitute a plurality of alternative aspects of the present disclosure. The embodiments according to this Description illustrate the best way known for implementing the present disclosure, and will enable those skilled in the art to utilize the present disclosure.

What is claimed is:

1. A method of high-density pattern forming, comprising:
   providing a substrate;
   forming a hard mask layer on the substrate;
   forming a sacrificial layer on the hard mask layer;
   forming photoresists arranged at intervals on the sacrificial layer;
   etching the sacrificial layer to enable the sacrificial layer to form a mandrel one-to-one corresponding to the photoresist, wherein a cross-sectional size of the mandrel gradually decreases from an end of the mandrel away from the hard mask layer to an end close to the hard mask layer;
   forming a first pan of an isolation layer on a top of the mandrel, a second part of the isolation layer on sidewalls of the mandrel, and a third part of the isolation laver on an exposed part of the hard mask layer;
   removing the first part of the isolation layer on the top of the mandrel and the third part of the isolation layer on the exposed part of the hard mask layer, and removing the mandrel, to form an isolation sidewall pattern; and
   transferring the isolation sidewall pattern to the hard mask layer;
   wherein etching the sacrificial layer comprises:
     etching the sacrificial layer in a first etching environment to form a first mandrel; and
     etching a sidewall of the first mandrel to form a second mandrel in a second etching environment;
   wherein the first etching environment and the second etching environment are both dry etching by taking $O_2$ and $CF_4$ as etching gases, and the second etching environment has a greater bias voltage than the first etching environment.

2. The method according to claim 1, wherein
   the first mandrel one-to-one corresponds to the photoresist, and the sidewall of the first mandrel is perpendicular to the hard mask layer; and
   wherein a cross-sectional size of the second mandrel gradually decreases from an end of the second mandrel away from the hard mask layer to an end close to the hard mask layer.

3. The method according to claim 1, wherein an angle between an etching direction and a vertical direction while etching the sidewall of the first mandrel is 70° to 89.9°.

4. The method according to claim 1, wherein the second etching environment has a bias power of 100 to 500 W and a pressure of 0.1 to 50 mtorr.

5. The method according to claim 1, wherein a material of the mandrel is carbon.

6. The method according to claim 1, wherein a material of the mandrel is a spin-on hard mask doped with C, N and H elements.

7. The method according to claim 6, wherein each element is doped in the material of the mandrel in a percentage, and C is from 60% to 90%, N is more than 0% and no more than 30%, and H is more than 0% and no more than 30%.

8. The method according to claim 7, wherein the percentage of the C element in the material of the mandrel gradually decreases from the end of the mandrel close to the hard mask layer to the end away from the hard mask layer, wherein the C element is of a percentage from 75% to 90% at the end of the mandrel close to the hard mask layer and is of a percentage from 60% to 75% at the end of the mandrel away from the hard mask layer.

9. The method according to claim 1, wherein the mandrel has a height of 30 to 50 nm, the top of the mandrel has a width of 20 to 22 nm, and a bottom of the mandrel has a width of 16 to 21.5 nm.

10. The method according to claim 1, wherein after forming the second mandrel by etching the sidewall of the first mandrel, the method further comprises roughening a sidewall of the second mandrel.

11. The method according to claim 10, wherein the roughening is implemented with a chemical vapor deposition process by taking $N_2$ and He as gases, which is performed at a temperature from 300 to 500° C. and in a power from 100 to 1000 W.

12. The method according to claim 1, wherein a material of the isolation layer is silicon oxide.

* * * * *